United States Patent
Zhang et al.

(10) Patent No.: US 9,231,732 B2
(45) Date of Patent: Jan. 5, 2016

(54) PACKET HEADER PROTECTION FOR UTILITY NETWORKS

(71) Applicant: Texas Instruments, Incorporated, Dallas, TX (US)

(72) Inventors: Yumin Zhang, Allen, TX (US); Wenxun Qiu, Allen, TX (US); Timothy Mark Schmidl, Dallas, TX (US); Anuj Batra, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 95 days.

(21) Appl. No.: 14/047,021

(22) Filed: Oct. 7, 2013

(65) Prior Publication Data

US 2015/0100856 A1  Apr. 9, 2015

(51) Int. Cl.
*H03M 13/00* (2006.01)
*H04L 1/00* (2006.01)
*G06F 11/07* (2006.01)
*G06F 11/14* (2006.01)

(52) U.S. Cl.
CPC .......... *H04L 1/0041* (2013.01); *G06F 11/0709* (2013.01); *G06F 11/1402* (2013.01)

(58) Field of Classification Search
None
See application file for complete search history.

(56) References Cited

U.S. PATENT DOCUMENTS

| | | | |
|---|---|---|---|
| 5,870,412 A * | 2/1999 | Schuster et al. | 714/752 |
| 6,836,862 B1 * | 12/2004 | Erekson et al. | 714/704 |
| 8,769,369 B2 * | 7/2014 | Hwang et al. | 714/752 |
| 2003/0018794 A1 * | 1/2003 | Zhang et al. | 709/231 |
| 2005/0015703 A1 * | 1/2005 | Terry et al. | 714/776 |
| 2006/0107166 A1 * | 5/2006 | Nanda | 714/748 |
| 2006/0256768 A1 | 11/2006 | Chan | |
| 2007/0055640 A1 * | 3/2007 | Dababneh et al. | 705/412 |
| 2008/0051036 A1 * | 2/2008 | Vaswani et al. | 455/69 |
| 2008/0080437 A1 * | 4/2008 | Krishnaswamy et al. | 370/338 |
| 2009/0003356 A1 * | 1/2009 | Vaswani et al. | 370/400 |
| 2009/0141723 A1 * | 6/2009 | Giesberts et al. | 370/392 |
| 2010/0058153 A1 * | 3/2010 | Sethuraman | 714/801 |
| 2011/0051706 A1 * | 3/2011 | Schmidl et al. | 370/338 |
| 2012/0054584 A1 * | 3/2012 | Roh et al. | 714/776 |
| 2012/0117446 A1 * | 5/2012 | Taghavi Nasrabadi et al. | 714/776 |

FOREIGN PATENT DOCUMENTS

| | | |
|---|---|---|
| WO | 2006000033 A1 | 1/2006 |
| WO | 2008033514 A2 | 3/2008 |

* cited by examiner

*Primary Examiner* — Daniel McMahon
(74) *Attorney, Agent, or Firm* — John R. Pessetto; Frank D. Cimino

(57) ABSTRACT

A networking device includes a packet header protect generator, a transmitter, a receiver, a decoder and router. The transmitter transmits a data packet to the receiver. The data packet includes a data packet header. The packet header protection generator is arranged to toggle selected bits of a protected portion of the data packet header and generate a data integrity signature. The receiver receives the data packet and generates a received data integrity signature. The decoder computes a locally computed data integrity signature in response to the protected portion of the received data packet header. The locally computed data integrity signature is compared with the received data integrity signature. The router selects a portion of a routing path in response to whether a data packet forwarding destination includes a decoder arranged to compute a locally computed data integrity signature.

3 Claims, 4 Drawing Sheets

PACKET HEADER PROTECTION FOR UTILITY NETWORKS

BACKGROUND

Utilities are increasingly using networked meters to reduce meter-reading costs and to monitor user consumption in real-time. Because of the relatively long life of meters (e.g., 20 years or longer), the cost of "retrofitting" or replacing various system components used to meter utility usage at each consumer location often leads to various generations of meters being used across the utility metering system. The various generations of metering systems often leads to upgrade problems and/or inefficiencies in the interoperation of the meters.

SUMMARY

The problems noted above can be solved in large part by a packet header protection system that, for example, provides a cost-effective solution for enhancing ad-hoc network communications. A packet header protection system includes, for example, a header checksum (HCS) that is arranged to provide error detection capability to FSK (frequency shift keying) packet headers. Accordingly, receivers in the network can more quickly terminate processing of an errored packet upon detection of error(s) in the header. Quickly detecting packet header errors helps the receiver to stop trying to decode a packet with errors or a non-existent packet so that it is available to receive other packets that may subsequently arrive. Accordingly, the packet header protection system reduces false alarm rate in the network and increases network throughput.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and thus are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion. The term "checksum" can mean a data integrity signature that includes information that is used to assess the validity of a sequence of bits in a communication, where the data integrity signature is generated, for example, by techniques including one or more of remaindering, parity checking, cyclical redundancy codes, Hamming codes, and the like. The term "repurposing" can mean the using an item (such as a bit position in a packet header) for a purpose that was not originally defined (such as by a standards committee that defines the packet header standard of legacy equipment).

Figure 1:
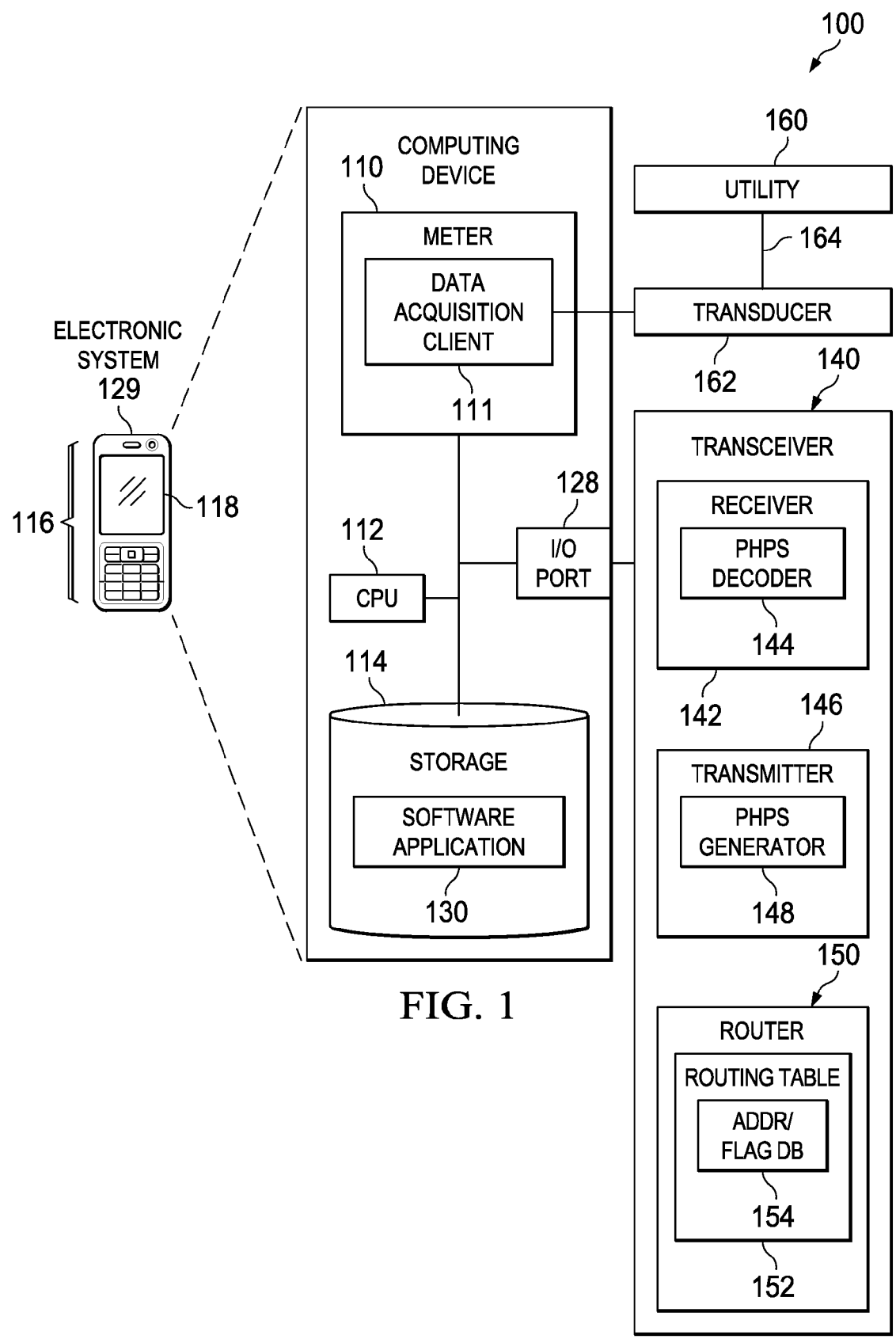
FIG. 1 shows an illustrative electronic device in accordance with example embodiments of the disclosure.

FIG. 1 shows an illustrative computing device 100 in accordance with preferred embodiments of the disclosure. For example, the computing device 100 is, or is incorporated into, an electronic system 129, such as a mobile device, a personal digital assistant, a personal computer, electronics control "box" or display, utility meter, or any other type of electronic system. The computing device 100 can be powered from line current, solar cell, and/or battery (or capacitive) storage.

In some embodiments, the computing device 100 comprises a megacell or a system-on-chip (SoC) which includes control logic such as a CPU 112 (Central Processing Unit), a storage 114 (e.g., random access memory (RAM)) and a meter 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100.

The meter 110 is monitoring system and comprises logic and functionality (embodied at least partially in hardware) that supports monitoring, testing, and debugging of the computing device 100 executing the software application 130. For example, the meter 110 can emulate one or more defective or unavailable components of the meter 110 to allow verification of how the component(s), were it actually functional on the computing device 100, would perform in various situations (e.g., how the components would interact with the software application 130). In this way, the meter 110 can be debugged in an environment which resembles post-production operation.

The meter 110 includes a data acquisition client 111 that is used, for example, for metering. As discussed below, the data acquisition client 111 can be a client with respect to a server of a utility and/or a peer with respect to other networked meters used in a utility network. The incorporated measurement circuitry can measure usage of metered commodities (and/or services) such as electricity, gas, sewer, water, and the like. The usage data can be used, for example, to monitor usage for each individual metered entity and to generate billing data for each such metered entity in accordance with the monitored commodity provided by a utility.

A data acquisition client 111 is a client with respect to, for example, a server associated with a utility (and/or base station associated with the utility). The data acquisition client 111 can be used to sequentially measure power usage of a consumer at defined intervals and to store the measurements in data storage 114. Billing amounts for individual entities can be generated and presented to an off-device billing agency (such as a public utility) so that bills can be generated that are based on the actual usage of each consumer. Accordingly, the data acquisition client 111 typically includes functionality for (at least) recording electric consumption for individual meters over various billing periods.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, and the like. The input is received using audio and/or video inputs (using, for example, voice or image recognition), and mechanical devices such as keypads, switches, proximity detectors, and the like. The CPU 112 and meter 110 is coupled to I/O (Input-Output) port 128, which provides an interface that is configured to receive input from (and/or provide output to) a transceiver 140. The computing device 100 can also be coupled to peripherals and/or computing devices, including tangible, non-transitory media (such as flash memory) and/or cabled or wireless media (including internet protocol over power lines). These and other input and output devices are selectively coupled to the computing device 100 by external devices using wireless or cabled connections. The storage 114 can be accessed by, for example, by a remote utility, meter reader, and/or consumer.

As disclosed herein, the computing device 100 includes a networking device such as transceiver 140 that is arranged to send and/or receive data packets (e.g., which contain usage information) from the meter 110. Transceiver 140 includes a receiver 142 and a transmitter 146. The transmitter 146 can be used to generate a modulated signal that is transmitted and received by a receiver 142 (e.g., of another meter 110). The modulated signal can be broadcast wirelessly and received by a RF receiver (e.g., of the other meter 110). The transceiver 140 can be arranged in a separate assembly from (or the same assembly of) the meter 110.

In various example embodiments, transceiver 140 is arranged to select a particular physical layer for transmission and reception of data packets in a transmit/receive (TX/RX) network (e.g., as described below with respect to FIG. 2). The transceiver 140 can be configured to be compatible with multiple wireless and/or power line communications protocols (e.g., where the modulated signal is propagated by modulating the power signal carried over power lines and received by various receivers of other meters or base stations coupled to the power lines). Thus, the physical layer can be selected in accordance with the availability of the protocol capabilities of other meters that are within range of a particular meter and in accordance with a destination address of an incoming data packet.

The transceiver 140 includes a router 150 arranged to provide a destination address to control transmission and/or forwarding data packets sent between meters (and/or utility base station) in a packet network. The routing table 152 in router 520 can be provided by the utility (for example, which is aware of the types of meters used at particular locations) or discovered on an ad-hoc basis as meters are installed (and/or upgraded) in an (e.g., ad hoc) smart utility network.

When a data packet is received by a receiver 142, the data packet is decoded using the disclosed PHPS (packet header protection system) decoder 144 to determine whether, for example, selected portions of the data packet are valid. The contents of the data packet are evaluated by the router 150, which is arranged to read the address information in the data packet to determine, for example, a forwarding (e.g., ultimate and/or intermediate) address for the data packet.

The communication can be forwarded to another meter 110 by using address information in a routing table 152. As described below, the data packet can be transmitted to a utility base station or forwarded from meter-to-meter until the data packet reaches the utility base station. For example, routing table 152 in each meter can be used to select a path for sending data packets across an ad-hoc network. As discussed above, the routing tables 152 can also be updated as new meters are installed and discovered and/or directly programmed by a utility provider.

The routing table 152 includes an address/flag database (ADDR/FLAG DB) 154 that is arranged to provide an indication of whether a potential receiving meter 110 includes a PHPS (packet header protection system) decoder 144. In an example embodiment, the router 150 is arranged to select a routing path that includes meters 110 (having the disclosed PHPS decoder 144). The router 150 can select a routing path that includes meters 110 (having the disclosed PHPS decoder 144) such that potential routing paths excludes intermediary meters that do not include a PHPS decoder, for example.

The communication to be forwarded (or otherwise transmitted) is sent to the transmitter 146. Transmitter 146 encodes a data packet (e.g., envelope for the communication to be sent) using the disclosed PHPS generator 148. When the forwarding address is associated with a (e.g., particular receiving) meter 110 (that includes the PHPS decoder 144), the PHPS generator 148 encodes a selected portion of the PHPS-encoded data packet with packet header protection information (as discussed below). The communication (and encoded packet header protection information) is transmitted via the PHPS-encoded data packet using a selected physical layer (that is selected in accordance with one or more protocols that are supported by the addressed receiver meter). The data packet is encoded with a destination address and broadcast of over the medium of the selected physical layer (e.g., wireless media).

Accordingly, the data acquisition client 111 can use processing resources (such as CPU 112) in order to derive quantity (and/or quality) metrics such as the total usage, maximum rate, minimum rate, time-of-day usage (for different billing rates), and the like. For example, the data acquisition system 111 is coupled to transducer 162 that is coupled to a utility supply line (including pipe, wire, cable, conduit, trunk-line, and the like) 164 by which the utility 160 supplies the utility service to the consumer. The data acquisition system 111 monitors transducer 162 to determine a quantity (and/or rate of consumption) of the utility 160 service (e.g., electricity, gas, water, and the like). As demand for conservation of resources increases, real-time consumption of the provided utility services become more important in meeting peak energy demands and monitoring conservation efforts.

A packet header protection system as disclosed herein can be provided as a retrofit kit having a transceiver such as transceiver 140. The upgrade kit can optionally include components such as drivers, receivers, converters, and transducers that are adapted to be coupled with the meter. In various embodiments, the components can be situated with (or within) a single chassis of a meter and/or can be positioned (electrically) between the transducers and the meter. In various embodiments, the components can be arranged to permit wired or wireless communications amongst the components.

Figure 2:
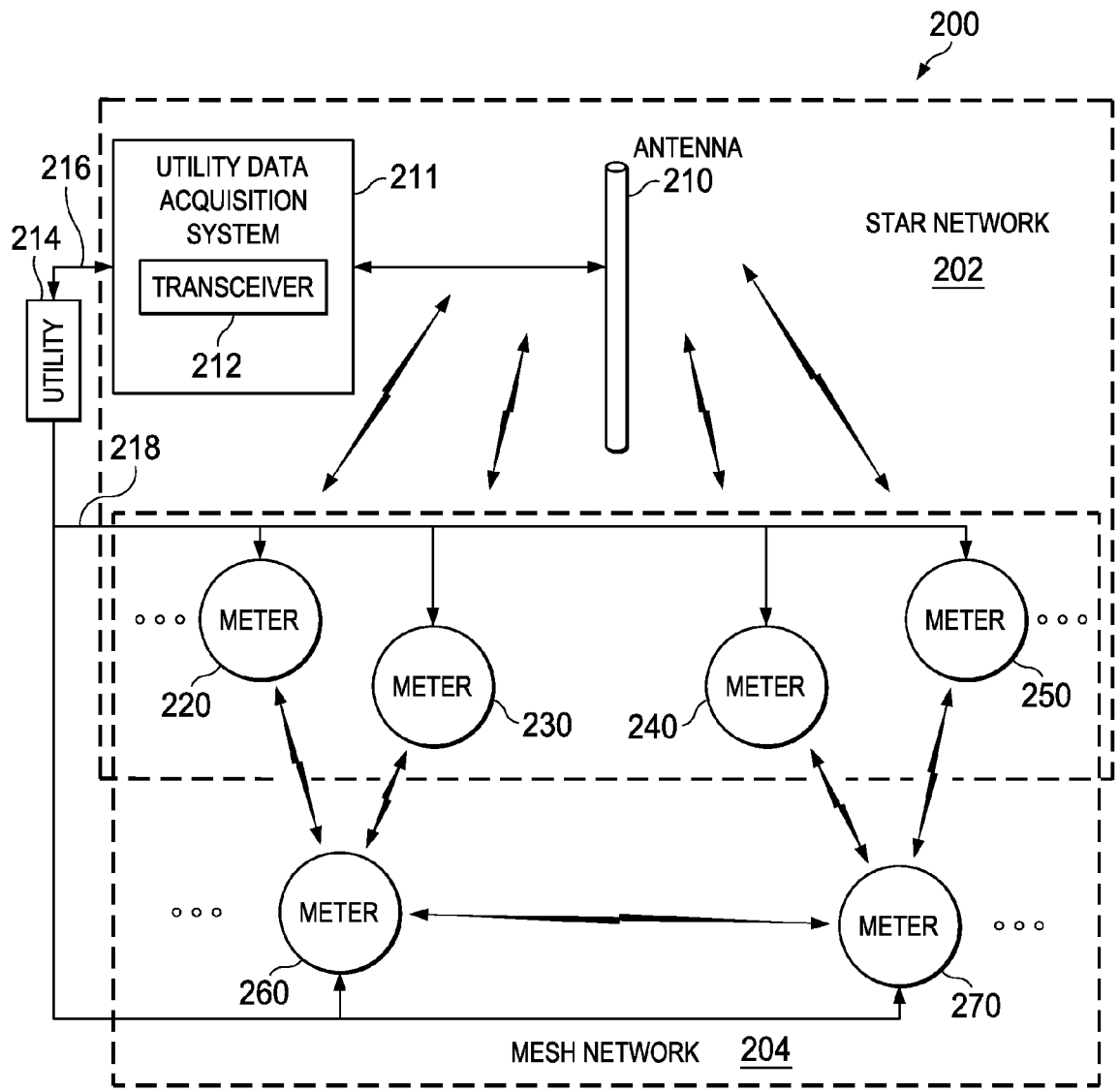
FIG. 2 is a schematic diagram illustrating configurations of a measurement system for performing utility usage measurements in accordance with example embodiments of the disclosure.

FIG. 2 is a schematic diagram illustrating configurations for performing electric metering measurements in a smart utility network in accordance with example embodiments of the disclosure. Generally described, the electric metering system 200 includes a utility data acquisition system 211 that is used as a subsystem that is arranged to measure individual electric usage of the electric metering system 200 for individual users (e.g., that are typically responsible for paying utility bills associated with a single meter). Although the metering system is described as being related to electrical power consumption, the disclosure is applicable to other provided utility or service-provided commodities such as water, gas, and the like.

The example electric metering system 200 includes a utility data acquisition system 211 that is coupled to an antenna 210. The utility data acquisition system 211 is arranged to provide a wireless link between the utility 214 and individual meters 220, 230, 240, 250, 260, and 270. The meaning of the term "meter" typically includes a computing device 100, as well as components that are arranged to perform and convey measurements. For example, meters 220, 230, 240, 250, 260, and 270 are electronic devices such as electronic system 129 (described above with reference to FIG. 1) and have components that are arranged to generated and convey measurement data. Thus, the electric metering system is 200 arranged to transfer data between any two components of the utility data acquisition system 111 and the meters 220, 230, 240, 250, 260, and 270. For purposes of clarity, the Figure illustrates networks 202 and 204 having a reduced number of meters (as compared with the number of meters that might be used in an actual system in accordance with the disclosed electric metering system 200).

Components of the example electric metering system 200 are communicatively coupled using a smart utility network (SUN). The smart utility network is illustrated as a low power/low data rate wireless technology that is adapted for use in metering applications. The metering applications typically include monitoring the usage of electricity, gas, or water and transmitting associated usage data from the meter(s) of the consumer premises to a utility data acquisition system 211 (hub) that forwards the collected usage data to the utility 214 (e.g., over a point-to-point wired or wireless link, an Internet connection, and the like).

In an example electric metering system 200, the various meters can be installed adjacent (e.g., in, on, or in a convenient location close by) to each house of a residential neighborhood. Accordingly, as more meters are added to the network, more intermediate nodes (e.g., for forwarding communication in the mesh network 204) are available to forward data packets, and thus greater demand exists for transmission capacity and greater (e.g., processing) power is consumed handling the various communications. Each meter is programmed to transmit usage data at a (e.g., regular) interval (such as every 15 minutes) across the example electric metering system 200 to the utility data acquisition system 111 (e.g., for processing of the usage data). Meters within range of a broadcasting meter "listen" to such broadcasts to determine whether a listening meter should rebroadcast a packet from the listened-to broadcast or aggregate the data from the listen-to broadcast as well as its own data so that increasingly larger packets are sent as more data is aggregated. The utility data acquisition system 111 is arranged to receive broadcast packets (e.g., that are intended for consumption by a utility) and can be coupled to a central office of the utility 214 using fiber, copper wire, or wireless networks.

A network can experience an increasing amounts of traffic that result when greater number of data packets or larger-sized packets are forwarded from between ever-increasing numbers of meters in the network. The problem is compounded in mesh networks where the possible number of connections between meters grows in geometric proportions to the number of added meters. The problem can be compounded even more when poor line-of-sight conditions (e.g., permanent or temporary) that occur in a network formed in an urban or suburban neighborhood having a relatively high density of meters (e.g., having many meters within range of other meters within the mesh network 204).

The utility 214 collects information received from each meter in the system (whether directly or indirectly received) to determine individual and collective usage information for each metered location. Data can either be sent directly from each meter to the collection point (via star network 202), and/or data can be forwarded from meter to meter (via mesh network 204) until a transmission reaches the antenna 210. For example, star network 220 includes individual meters 220, 230, 240, and 250 that are each configured to communicate with antenna 210 directly, whereas mesh network 204 includes meters 220, 230, 240, 250, 260, and 270 (not all meters need be included in mesh network 204) where each meter is are arranged to communicate with other meters within range of the broadcasting meter. Thus, meter 270 (which, for example, might not be within range of direct coverage provided by antenna 210) can transmit a data packet to meter 240 (which is in wireless range of meter 270), which in turn is arranged to forward (over a point-to-point connection of the star network 202) the data packet or aggregate the data with its own data wirelessly to the antenna 210.

Accordingly, the electric metering system 200 is arranged having a complex topology having portion arranged as star network 202 and a portion arranged as a mesh network 204, where portions of the star network 202 and the mesh network 204 overlap respectively. As discussed above, meters within the mesh network 204 are arranged to communicate with one or more neighboring meters (e.g., that are within range of direct wireless communications between respective meters). The mesh network 204 is arranged to reduce power consumption (and/or increase coverage) of the network because a greater number (e.g., stable) connections can be achieved even when adverse wireless communication conditions (foliage, water vapor, physical structures, topographic features, electrical noise, and the like) are (e.g., temporarily or permanently) present in the communication path between each meter and antenna 210. The greater number of connections can also be handled in a more power-efficient (e.g., both electrical and processing) manner.

The data communications of the smart utility network are typically layered in accordance with layered network protocol schemes. Different physical layers (PHYs) used for the smart utility network (SUN), can include including FSK (frequency shift keying), DSSS (direct sequence spread spectrum), and OFDM (orthogonal frequency division multiplexing) protocols. In a closed utility network, the devices (and types thereof) that are allowed access into the network can be controlled by the utility or the network operator.

The smart utility network is arranged to accommodate differing types and revisions of the physical layers that can be present in ad hoc (e.g., existing) utility networks. Because existing meters may have a long life span (such as 20 years) there can be various generations of meters simultaneously deployed in a given utility network. The earlier deployed meters (e.g., legacy devices) in the utility network might communicate using FSK, often at a fixed data rate such as 50 kb/s, 100 kb/s or 150 kb/s.

Each meter in the network typically remains in a quiet mode (e.g., for around 5 to around 15 minutes) and periodically enters a relatively brief transmission mode (e.g., for less than a second) where packet(s) of data are transmitted over a relatively short period of time. After transmission, the meter enters a quiet mode (such as a receive mode or a "sleep mode") to conserve energy. On the receiver side, the receiver evaluates (e.g., listens to) received transmissions over a selected radio frequency (RF) band to determine, for example, whether a data packet is being transmitted. If a data packet is detected, the receiver proceeds to decode the symbols forming the data packet. The data packet normally has a predefined frame structure to help a receiver detect the data packet and determine a beginning of the data payload.

Typically, the PHR header contains header information used in decoding of the data packet. However, the conventional FSK PHY header does not have a defined error detection capability. Thus, an error in any of the conventional, non-reserved fields typically results in the containing data packet being decoded incorrectly. In addition, when the frame length information becomes corrupted (for example by channel noise), the corrupted frame length information can result in the receiver using an incorrect length that defines the time period over which a received packet is to be decoded. For example, if an error occurs in a packet length value where a relatively short value packet length (e.g., of seven bytes) becomes corrupted into a relatively long data packet length (e.g., by the most significant bit of the packet length field being interpreted incorrectly as logic 1), the receiver then attempts to decode a putative (e.g., corrupted) data packet having a much longer length (e.g., of 1031 bytes). If any new data packet arrives during the decoding period, the receiver is not normally able to simultaneously decode the new data packet because of the receiver is attempting to decode an portion of a data packet (that does not exist) over an erroneously long period of time.

Another type of error in the receiver is a false alarm, where no data packet is transmitted and random noise is erroneously interpreted as a preamble and SFD sequence. Erroneously detecting a preamble and SFD sequence can cause the receiver to make a false detection and start decoding a putative (e.g., corrupted) data packet (that in fact, does not exist). When the false alarm occurs, the receiver is typically "tied up" for a long time (as discussed above), and thus would fail to detect and decode any valid packets that arrive during the time the receiver is attempting to process a putative (e.g., corrupted) data packet.

As disclosed herein, a packet header protection system is arranged, for example, to provide a cost-effective solution for enhancing ad-hoc network communications. The packet header protection system includes a data integrity signature (for example a checksum) that is arranged to provide error detection capability to a portion of the header of a FSK packet. Accordingly, receivers in the network can more quickly detect error(s) in the header and selectively (e.g., appropriately) handle the errored packets. For example, quickly detecting packet header errors allows bad (or non-existent) packets to be identified and a responsive action taken before decoding all bits of the bad (or non-existent) packet. The packet error handling includes taking a responsive action such as termination of the processing (e.g., decoding) of all the bits identified by the packet length header, for example, which avoids wasteful processing. Accordingly, the packet header protection system reduces false alarm rate in the network and increases network throughput.

Figure 3:
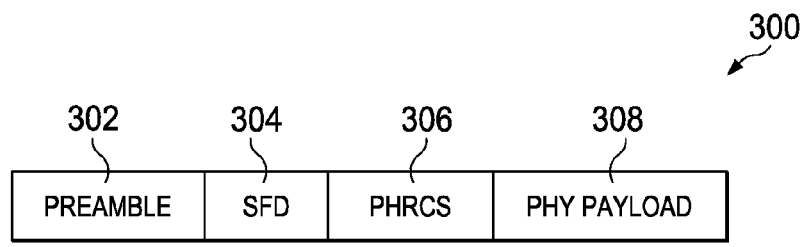
FIG. 3 is a schematic diagram that illustrates a frame structure for a SUN FSK Mode in accordance with example embodiments of the disclosure.

FIG. 3 is a temporal-spatial diagram that illustrates a structure of an FSK-mode packet frame in accordance with example embodiments of the disclosure. The frame structure 300 includes fields such as preamble 302, a start frame delimiter (SFD) 304, a physical layer header with checksum indicator (PHRCS) 306, and a physical layer (PHY) payload 308. The preamble 302, SFD 304 and, PHRCS 306 can be referred to (collectively) as a "packet header," whereas the PHY payload 308 can be referred to as "data payload" or "payload."

The preamble 302 includes a predetermined sequence of bits that is used by the receiver to detect the data packet and identify the beginning of the data payload. For example, the preamble 302 can be a recognizable pattern (such as a repetitive "01010101" sequence). The start frame delimiter (SFD) 304 is typically a unique sequence that is, for example, 16 or 32 bits long. The SFD 304 can be used in combination with the preamble 302 by the receiver in the identification the start of the data packet.

The PHRCS 306 can be, for example, a field that is 16 bits long and includes a physical layer header (PHR) and a checksum (CS) indicator. The PHR header is combined with data integrity information such as checksums or correction codes (that can included as payload in the PHY payload field), such that errors in the PHR header can be quickly detected (e.g., by comparing a received checksum against a new checksum generated locally) such that the corrupted packet can be processed appropriately at the receiver. For example, when an error in the PHRCS is detected by the receiver, the receiver can (e.g., selectively) discard the packet having the detected error and resume searching for a next valid packet header.

The PHRCS 306 is also arranged to provide information used to reduce the false alarm (e.g., false detection) rate. For example, noise might (initially) resemble a valid preamble and SFD sequence, thereby causing the receiver to make a false detection. Thus, processing the checksum in the PHRCS 306 allows the receiver to determine, for example, whether the sequence of symbols being evaluated indicates an invalid or non-existent packet. If an invalid packet is determined, processing of subsequent symbols in the potential packet is halted and searching for a next valid packet header is resumed. Resuming searching for a next valid packet header upon detection of the data error is detected increases the probability that a subsequent valid packet is not missed (e.g., due to processing of spurious noise which might miss the preamble of a next subsequent valid packet).

Figure 4:
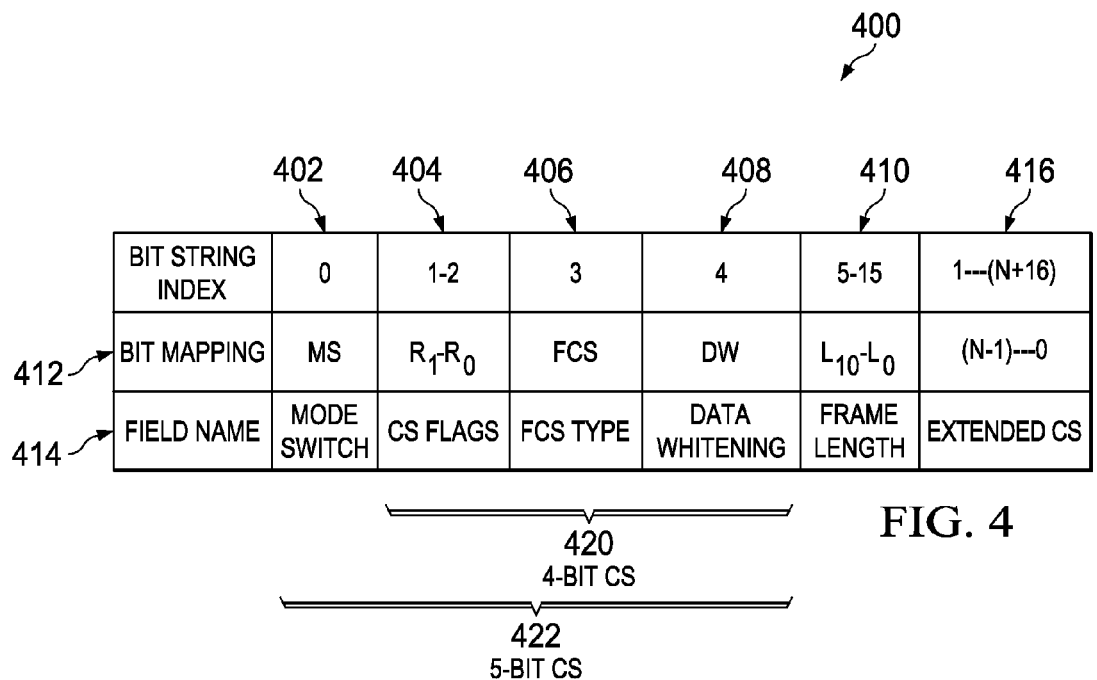
FIG. 4 is a table that illustrates the organization of a bit string in a SUN FSK Mode PHR Header in accordance with example embodiments of the disclosure.

FIG. 4 illustrates an example of a physical layer header with checksum indicator (PHRCS) header of an FSK-mode physical layer packet in a smart utility network in accordance with example embodiments of the disclosure. The conventional FSK PHR header has two reserved bits, which are undefined in conventional systems. As disclosed herein, the two reserved bits are used in the conveying of data integrity information such as checksum (CS) bits.

Checksum-validated FSK-mode PHR header 400 indicates a bit mapping 412 (and the associated field names 414) of the checksum-validated FSK-mode PHR header 400. (The checksum-validated FSK-mode PHR Header 400 is, for example, an improvement over the conventional IEEE standard 802.15.4g.) The checksum-validated FSK-mode PHR Header 400 normally includes 16 bits that are divided into five different fields, each with its own definition. For example, columns 402, 404, 406, 408, and 410 each respectively represents fields used to store information concerning the mode switch (MS), checksum flags (R1-R2), frame check sequence type (FCS Type), data whitening (DW), and frame length (L10-L0) fields. Thus, bit 0 indicates the state of the mode switch (MS), bits 1-2 indicate a checksum value, bit 3 indicates the the frame check sequence type (FCS Type), bit 4 indicates whether the packet has been "whitened" by a pseudo-noise (PN) sequence during encoding, and bits 5 through 15 indicate the length of the data payload (frame length L10-L0).

The checksum-validated FSK-mode PHR header 400 is employed in packets transmitted across a network such as a closed network deployed (e.g., controlled) by a utility company. The utility company deploying the network can predetermine the usage of network parameters such as the mode switch (MS), data whitening (DW) and Frame Check Sequence Type (FCS type) fields in the PHR header. Thus, in example embodiments the bit positions defined as FCS type and Data Whitening to provide an additional two bits such that four bits (e.g., stored using the bit 1 through bit 4 positions described in columns 404, 406, and 408) in the PHR header can be used to provide a 4-bit checksum for enhanced protection of the packet length bits (which are stored bit positions 5 through 15). Thus, bit positions 1 through 4 can be used to store a checksum that can be used to validate a portion of the header (such as the frame length field) of an FSK-mode physical layer packet. Alternatively, the mode switch bit can also be used in the checksum to have a 5-bit checksum using bit positions bit 0 to bit 4.

In various example embodiments, a header checksum (CS) can be formed by a cyclic redundancy code (CRC). Generally, an optimum-length CRC code can be selected in accordance with the length of data that is to be protected. For example, for a payload length of 11 bits, an 5-bit CRC value is an optimum length. The 5-bit CRC value can be generated in accordance with the generator polynomial:

$$G(x) = x^5 + x^2 + 1$$

For a short data packet sizes, the MSB's of the data packet length field are typically padded with leading zeros. To avoid a long sequence of zeros in the frame length field, selected bits (such as odd or even) bits in the PHR frame length field can be toggled (e.g., so as to generate a more robust CRC value). Thus a new CRC value for the 11 bits can be calculated using toggled bits in the frame length field. The checksum-validated FSK-mode PHR header 400 bits positions 0 through 4 can be used to store the CRC checksum as 5-bit CS 422.

In various example embodiments, a header checksum using less than five bits can be used. For example, a CRC checksum having a length of four bits can be used in conjunction with a corresponding CRC polynomial $G(4) = x^4 + x + 1$; a CRC checksum having a length of three bits can be used in conjunction with the CRC polynomial $G(3) = x^3 + x + 1$; and the like. In further embodiments, CRC polynomials having lengths different than the ones described above can be used. As discussed further below, bits in column 416 can be used to store and/or extend the length of a checksum of arbitrary length. Additionally, a CRC checksum can be computed for the data payload (which is normally transmitted after the data packet header is transmitted), and this is called a frame check sequence (FCS). The FCS is typically 16 or 32 bits and is sent with the data payload.

In an example embodiment, errors in a transmitted PHR header can be detected toggling odd-indexed (or, e.g., even-indexed) binary bits (e.g., performing an exclusive-OR function) in the PHR frame length field (e.g., shown in column 410). The toggled frame length field bits are then used to form a polynomial P(x), with bit 15 of the frame length field being the coefficient of the highest order term $x^{10}$ in P(x); and bit 5 being the lowest order terms $x^0$ in P(x). Subsequently, a remainder of the polynomial P(x) is calculated using polynomial division in accordance with the equation $P(x)*x^5/G(x)$. The coefficient of the highest term ($x^4$) in the remainder is used to set bit 4 in the PHR header, and the coefficient of the lowest term $x^0$ in the remainder is used to set bit 0 in the PHR header. Using the 5-bit CRC check bits as disclosed herein reduces the false alarm rate to 1/32 of that of an conventional (e.g., un-protected) PHR header. The decreased false alarm rate thus typically improves overall packet detection rate and network throughput.

Figure 5:
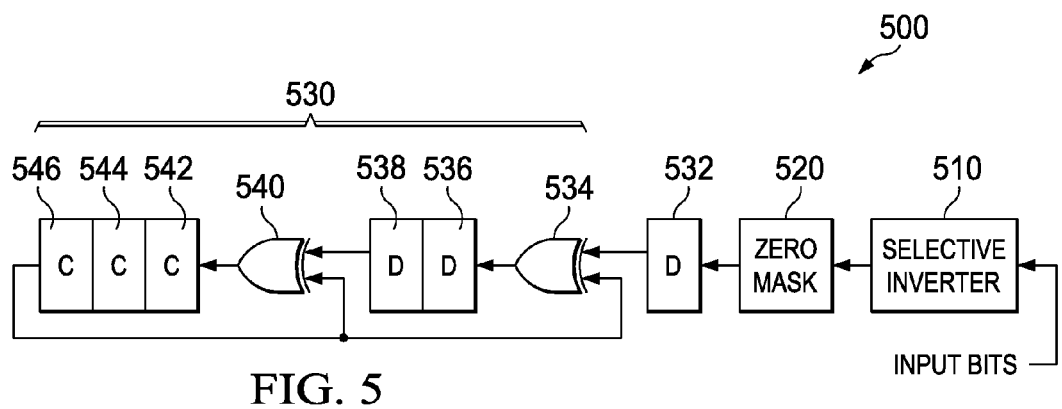
FIG. 5 is a block diagram illustrating a hardware implementation for calculating a CRC checksum in accordance with example embodiments of the disclosure.

FIG. 5 illustrates a circuit that is arranged to calculate the CRC checksum in a PHR header in accordance with example embodiments of the disclosure. The CRC generator 500 is arranged to generate a cyclical redundancy check values in accordance with a CRC polynomial (e.g., G(x)) used in error detection. The CRC generator 500 includes shift registers (such as shift registers 532, 536, 538, 542, 544, and 546) having feedback paths (in feedback mechanism 530) in accordance with the polynomial G(5).

The CRC generator 500 is arranged to receive PHR data packet length field bits to produce the cyclical redundancy check values. The received PHR data packet length field bits are coupled to the input of selective inverter 510. The selective inverter 510 selectively toggles the odd-indexed bits which avoids, for example, a long sequence of zeros (which is an input value for which error detection is typically not robust). In one example, the selective inverter 510 is an XOR (exclusive-OR) gate having a first input coupled to receive the PHR data packet length field bits and a second input that is arranged to control whether the first input is to be inverted. In various example embodiments, about half of the bits are inverted, such as the odd-numbered bits of the PHR data packet length field bits.

In various embodiments, a packet header generator is arranged to generate the header checksum by toggling selected bits in a length field of the data packet header. However, the selected bits are not transmitted having toggled values (e.g., such that a legacy meter can receive the data packet header without error). Thus, the transmitter is arranged to transmit the selected bits in the length field of the data packet header having values that are not toggled by the packet header generator.

The selectively inverted PHR data packet length field bits are coupled to the input of zero mask 520. Zero mask 520 is arranged to append a number of bits that corresponds to the length of the CRC polynomial. Thus, for example, zero mask 520 is arranged to append five bits to the end of the selectively inverted PHR data packet length field bits, where each of the appended bits is masked to (e.g., set to) the value of zero. (As discussed above, other lengths and configurations of the CRC generator 500 are possible.)

The selectively inverted PHR data packet length field bits and the appended five bits are serially clocked through (the clock signal is not shown for the purpose of clarity) the shift registers until the last of the appended bits is clocked into shift register 532. For example, XOR gates 534 and 540 are inserted in the feedback mechanism 530 at locations that correspond to the CRC polynomial (e.g., G(5)) used in the CRC calculation. A first input of each XOR gate is coupled to the output of a respective shift register and the second input of each XOR gate is coupled to the output of the feedback mechanism 530. (In various embodiments the number of XOR gates and the placement thereof varies in accordance with the particular CRC polynomial implemented by a CRC generator, such as CRC generator 500). After the last zero is clocked into the shift register 532, the contents of shift registers 546, 544, 542, 538, and 536 form the CRC checksum bits (where shift register 546 includes the value of the most significant bit).

In other example embodiments, a four-bit CRC checksum can be used and a fifth bit (having a predefined bit location that is known to both transmitter and receiver) to indicate whether a CRC checksum is used for the PHY header that includes the four-bit checksum. For example, bit 1 in the header (e.g., one of the two reserved bits in the standard used in the ad hoc network) can be used for this purpose. If bit 1 is set to a logic one, a CRC checksum is used (thus extending the length of the PHY header in the packet over the defined length of the packet as defined by the standard). If bit 1 is set to a logic zero, no CRC checksum is used and the PHY header follows the current standard (e.g., the PHY header is of normal length and arrangement).

The selective ability to include (or not include) the CRC checksum in a communicated packet thus allows, for example, enhanced communication capabilities in ad-hoc networks as well as maintaining backward compatibility. Thus, for example, in the mesh network 204 a received packet (that does not have the CRC checksum included because of the presence of legacy meters) can be forwarded by a meter 110 having packet header protection to another meter 110 having packet header protection (where the forwarded packet includes checksum information in a header of the packet) where the meter 110 receiving the forwarded packet is arranged to evaluate the header checksum information the received packet. Thus, the quality of communications in an ad-hoc network can be enhanced without upgrading all meters within the ad-hoc network.

As an example, a legacy meter can generate a legacy data packet (that does not include a PHPS checksum). A PHPS-enabled meter 110 can receive the packet that does include the PHPS checksum and generate PHPS checksum to be included in a PHPS-enabled data packet that is generated in response to the received (PHPS-less) data packet. The PHPS-enabled data packet can be generated by repurposing bits in the PHY header in order to store the PHPS checksum.

The PHPS-enabled data packet can also be generated by using an extended PHY header. For example, the CS flags in column 404 can be used to indicate the presence of an extended PHY header. When the CS flags in column 404 indicate the presence of an extended PHY header, the PHPS decoder evaluates the CS flags to determine how the information (e.g., in column 416) in the extended PHY header is to be used. The CS flags can indicate the length of the extended PHY header as an coded value and/or provide an indication that the length, arrangement, type, and other attributes of the checksum (such as the polynomial used to generate the CRC) is stored in column 416. Thus, information stored in column 416 can be used to store (and/or extend the length of a checksum over 5-bits long) of arbitrary length. Typically, the checksum length (and the associated CRC polynomial) are associated with a given revision level of a PHPS-enabled meter 110 and used in determination of a routing path for a data packet.

In the example, the newly generated PHPS-enabled data packet is forwarded to another PHPS-enabled meter in accordance with PHPS-enable routing schemes. The PHPS-enabled meter to which the PHPS-enabled data packet is sent, is selected in response to a routing table 152 that is arranged to identify PHPS-enabled meters. Thus, PHPS-enabled communications can be accomplished (e.g., initiated, restored, and the like) between each pair of sending and receiving PHPS-enabled meters 110. Thus, an efficient routing path can be selected by (e.g., overlapping) pairs of PHPS-enabled meters using routing information in conjunction with an identification of which meters in a network are PHPS-enabled. Accordingly, a routing path can be selected that is capable of supporting PHPS-related protocols over at least a portion of a data packet route between the address of origin and the destination address.

Although the disclosed packet header system has been illustrated with respect to a physical layer header, other portions of a packet (and/or packet headers) can be encoded using (in the alternative or in conjunction with) other selected portions of a packet. In accordance with the teachings herein, various error-detection schemes can be used to encoding validity information of an initial portion (such as the packet header) of the packet header such that, for example, packet processing can be immediately halted when an incorrect portion of the (putative and/or corrupted) packet is detected. Thus, alternative or supplemental checksums can be generated and added to the data packet, for example, where a header checksum can be generated for the data packet length field (and/or other fields) in the header.

In the various example embodiments, the bits to be protected can be manipulated differently from the above described illustrations (e.g., inverting odd- or even-indexed bits before calculating the CRC checksum). The example embodiments can include error detection with (or without) toggling the bits, toggling even-indexed bits, or other schemes of bit manipulations. The example embodiments can also include error detection that includes toggling selected bits of the packet length field, which minimizes the number of consecutive zeros transmitted for the header. Another example embodiment can include toggling every-other bit within a sequence of consecutive zeros of the data packet length field to compute the header checksum but to transmitting the original (e.g., un-toggled) data packet length field as part of the transmitted packet.

Figure 6:
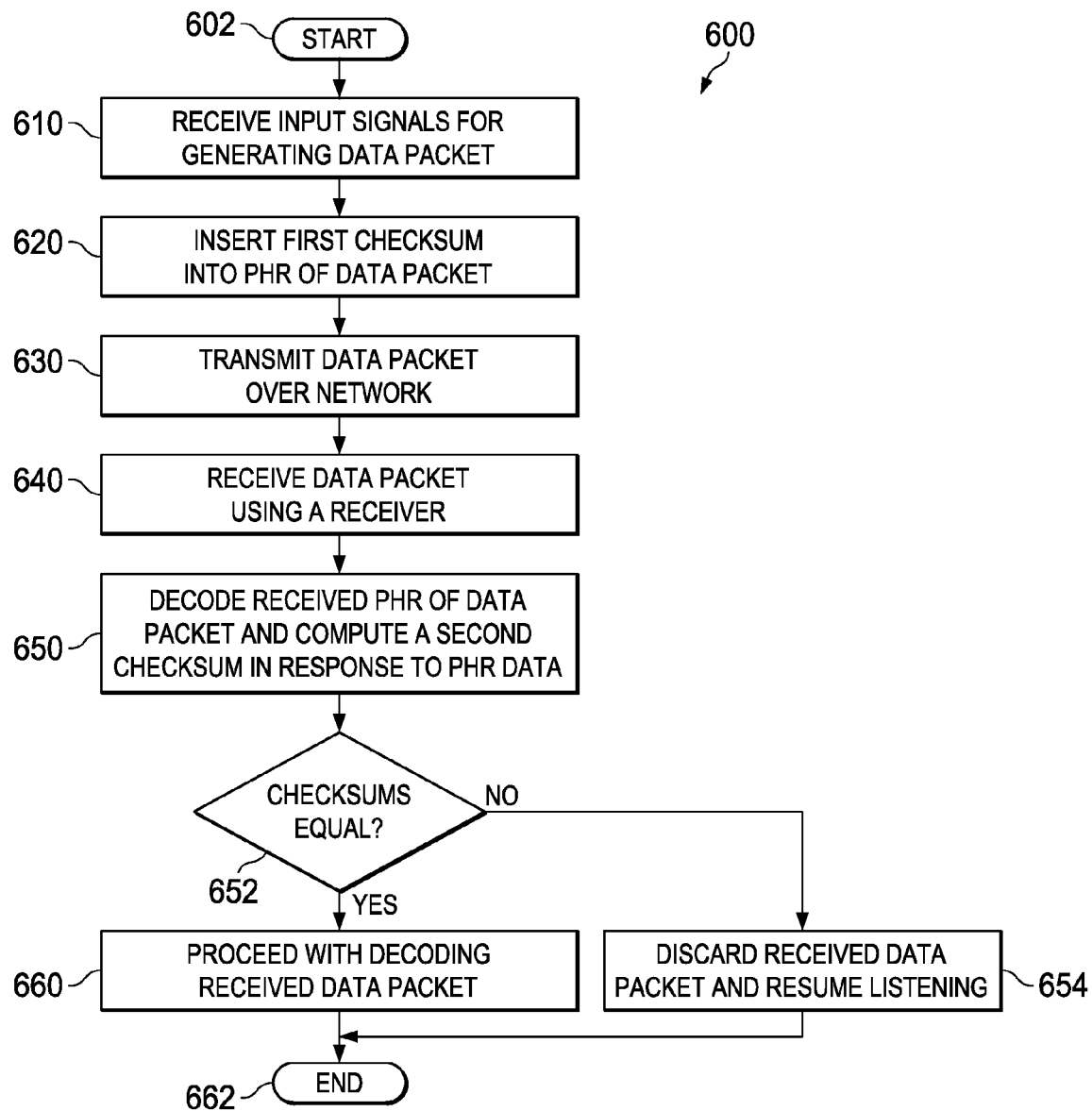
FIG. 6 is a flow chart illustrating a method of protecting a data packet header for transmitting utility usage data in accordance with example embodiments of the disclosure.

FIG. 6 is a simplified flow chart 600 illustrating an example of a method of protecting a data packet header for transmitting utility usage data in accordance with example embodiments of the disclosure. The method is initiated at operation 602, and proceeds to operation 610 where input signals indicating metered usage for generating a data packet (e.g., that indicates a status of a meter) are received by a transmitter. The data packet can be generated using local usage data (e.g., associated with consumption measured by the meter currently generating the data packet), using a non-PHPS-enabled data packet received from another meter, using a PHPS-enabled data packet received from another meter, or using an aggregated data packet which may be PHPS-enabled or non-PHPS-enabled.

In operation 620, a first checksum is generated using a portion of a header of the data packet to be generated where the packet to be generated includes a frame structure with a physical layer header. The first checksum is a data signature that is to be used for validating contents of a portion of the data packet to be sent. For example a first checksum is computed using information contained in a portion of a header of the data packet (e.g., such as a packet length field). The first checksum can be generated using a CRC generator as described above. The first checksum information is added to the physical layer header (e.g., by repurposing bits) and embedded in the data packet to be transmitted.

In operation 630, the data packet, including the physical layer header with the associated checksum, is transmitted over a packet network such as a smart utility network. For example, the data packet (which includes the physical layer header and payload) is transmitted from an originating metering device to a receiving metering device (e.g., that is different from the originating metering device) or to a utility data acquisition system (e.g., that collects usage data for usage monitoring purposes).

In operation 640, the transmitted data packet is received by a receiver in the network. The receiver can be, for example, an RF receiver of a meter that is different than the receiving meter or an RF receiver of the utility data acquisition system. Depending on results from operations 650 and 652 (for example), not all portions of the transmitted data packet are necessarily received.

In operation 650, the receiver starts to decode various portions the frame structure of the data packet. When the receiver decodes frames within the data packet, the receiver typically extracts both the transmitted checksum and the transmitted field used to compute the transmitted checksum. The receiver uses the extracted checksum and transmitted field to compute a comparison checksum.

In operation 652, the receiver compares the computed second checksum with the first checksum embedded in the frame structure. If the received checksum and the comparison checksum values do not match, process flow continues to operation 654. If the received checksum and the comparison checksum values do match, process flow continues to operation 660.

In operation 654, the received data packet is discarded and concurrent processing of the received data packet (such as the payload portion) is terminated. When the processing of the received data packet terminates, the receiver is then available to resume listening for a new packet (as in operation 610). In operation 660, the receiver proceeds with decoding the data packet and processing of the received data. When the data packet is decoded, contents of the decoded data packet can be (for example) forwarded to be received by another receiver (as in operations 630 and 640) or evaluated by the utility data acquisition system. The process terminates in operation 662.

In various example embodiments, the method may include preparing data to be transmitted in a data packet including a frame structure, repurposing storage locations in a physical layer header of the frame structure to include a first checksum, transmitting the data packet over a network, receiving the data packet with a receiver that is arranged to listen continuously, to compute a second checksum based on data embedded in the physical layer header, and to compare the second checksum with the first checksum stored in the physical layer header, and discarding the data packet when the first checksum does not match the second checksum. In some embodiments, the physical layer header includes a frame length field. The checksum can be calculated based on two or more input bits in the frame length field by (optionally) selectively inverting the input bits, by zero masking a final sequence of input bits of a sequence that is clocked through a series of shift registers with a feedback mechanism to create the checksum.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A networking device, comprising:
a transmitter that is arranged to transmit a data packet to a receiver, the data packet including a data packet header; and
a packet header protection generator that is arranged to toggle selected bits of a protected portion of the data packet header and to generate a data integrity signature in response to the protected portion of the data packet header, wherein the data integrity signature is included in an initial portion of the data packet, and wherein the data integrity signature is arranged to allow determination of at least one error in the protected portion of the data packet header;
a receiver that is arranged to receive the data packet having a received data integrity signature generated in response to the protected portion of the received data packet header, wherein the protected portion of the received data packet header includes selectively toggled bits; and
a decoder that is arranged to compute a locally computed data integrity signature in response to the protected portion of the received data packet header, is arranged to compare the locally computed data integrity signature with the received data integrity signature stored in the data packet frame structure, and is arranged to perform a responsive action in response to the comparison of the locally computed data integrity signature with the received data integrity signature; and
a router that is arranged to select a portion of a routing path in response to a determination of whether a data packet forwarding destination includes a decoder that is arranged to compute a locally computed data integrity signature in response to a protected portion of a forwarded data packet header.

2. A utility meter, comprising:
a transmitter that is arranged to transmit a transmitted data packet to a receiver of another meter in a utility network, the transmitted data packet including a data packet header;
a receiver that is arranged to receive a data packet from a transmitter of another meter in the utility network, the data packet from a transmitter of another meter in the utility network having a received data integrity signature generated in response to a protected portion of a received data packet header;
a packet header protection generator that is arranged to toggle selected bits of a protected portion of the data packet header of the transmitted data packet and to generate a transmitted data integrity signature in response to the protected portion of the data packet header of the transmitted data packet and to include the generated transmitted data integrity signature in the transmitted data packet; and
a decoder that is arranged to compute a locally computed data integrity signature in response to a protected portion of the received data packet header, to compare the locally computed data integrity signature with the received data integrity signature stored in a data packet frame structure, and to perform a responsive action in response to the comparison of the locally computed data integrity signature with the received data integrity signature;
wherein the utility network is a low-power wireless network that is arranged to collect usage data in response to transmitted data packets transmitted from a plurality of meters in the utility network.

3. A utility meter, comprising:

a transmitter that is arranged to transmit a transmitted data packet to a receiver of another meter in a utility network, the transmitted data packet including a data packet header;

a receiver that is arranged to receive a data packet from a transmitter of another meter in the utility network, the data packet from a transmitter of another meter in the utility network having a received data integrity signature generated in response to a protected portion of a received data packet header;

a packet header protection generator that is arranged to toggle selected bits of a protected portion of the data packet header of the transmitted data packet and to generate a transmitted data integrity signature in response to the protected portion of the data packet header of the transmitted data packet and to include the generated transmitted data integrity signature in the transmitted data packet; and a decoder that is arranged to compute a locally computed data integrity signature in response to a protected portion of the received data packet header, to compare the locally computed data integrity signature with the received data integrity signature stored in a data packet frame structure, and to perform a responsive action in response to the comparison of the locally computed data integrity signature with the received data integrity signature; and a router that is arranged to select a portion of a routing path in response to a determination of whether a data packet forwarding destination includes a decoder that is arranged to compute a locally computed data integrity signature in response to a protected portion of a forwarded data packet header.

* * * * *